(12) United States Patent
Zhang et al.

(10) Patent No.: US 12,363,885 B2
(45) Date of Patent: Jul. 15, 2025

(54) SEMICONDUCTOR MEMORY DEVICE AND METHOD OF FABRICATING THE SAME

(71) Applicant: Fujian Jinhua Integrated Circuit Co., Ltd., Quanzhou (CN)

(72) Inventors: Janbo Zhang, Quanzhou (CN); Yu-Cheng Tung, Quanzhou (CN)

(73) Assignee: Fujian Jinhua Integrated Circuit Co., Ltd., Quanzhou (CN)

( * ) Notice: Subject to any disclaimer, the term of this patent is extended or adjusted under 35 U.S.C. 154(b) by 442 days.

(21) Appl. No.: 18/080,751

(22) Filed: Dec. 14, 2022

(65) Prior Publication Data
US 2024/0064960 A1    Feb. 22, 2024

(30) Foreign Application Priority Data

Aug. 22, 2022  (CN) .......................... 202211008223.3
Aug. 22, 2022  (CN) .......................... 202222211637.8

(51) Int. Cl.
*H10B 12/00*      (2023.01)
*G11C 5/06*       (2006.01)

(52) U.S. Cl.
CPC ............ *H10B 12/31* (2023.02); *G11C 5/063* (2013.01); *H10B 12/0335* (2023.02); *H10B 12/34* (2023.02); *H10B 12/488* (2023.02)

(58) Field of Classification Search
None
See application file for complete search history.

(56) References Cited

U.S. PATENT DOCUMENTS

| | | | |
|---|---|---|---|
| 8,946,077 B2 | 2/2015 | Lee et al. | |
| 9,379,001 B2 | 6/2016 | Choi et al. | |
| 9,419,000 B2 | 8/2016 | Kim et al. | |
| 9,881,865 B1 | 1/2018 | Kim et al. | |
| 2019/0273083 A1* | 9/2019 | Liou | H10B 12/01 |
| 2021/0272961 A1* | 9/2021 | Tung | H10B 12/34 |
| 2022/0254785 A1* | 8/2022 | Lai | H10B 12/488 |
| 2023/0094529 A1* | 3/2023 | Park | H10B 12/482 257/295 |

* cited by examiner

*Primary Examiner* — Steven M Page
(74) *Attorney, Agent, or Firm* — Winston Hsu

(57) ABSTRACT

The present disclosure provides a semiconductor memory device and a fabricating method thereof, which includes a substrate, a plurality of buried word lines, and a plurality of storage node contacts. The substrate includes a plurality of active areas and a shallow trench isolation. The buried word lines are embedded in the substrate, across the shallow trench isolation and the active areas. The storage node contacts directly contact the active areas and include a plurality of first plugs, with each first plug including an insulating material and a conductive material stacked sequentially from bottom to top. Within the semiconductor memory device, at least one active area simultaneously contacts two of the first plugs, or a storage node pad physically contacts at least two of the first plugs. Thus, the present disclosure is beneficial on forming the semiconductor memory device with better component reliability.

20 Claims, 10 Drawing Sheets

SEMICONDUCTOR MEMORY DEVICE AND METHOD OF FABRICATING THE SAME

BACKGROUND OF THE INVENTION

1. Field of the Invention

The present disclosure relates to a semiconductor device and a method of fabricating the same, in particular to a semiconductor memory device and a method of fabricating the same.

2. Description of the Prior Art

With the trend of miniaturization of various electronic products, the design of dynamic random access memory (DRAM) having recessed gate structures must meet the requirements of high integration and high density. For a DRAM cell having recessed gate structures, because the carrier channel of which is relatively long in the same semiconductor substrate compared with that of the DRAM without recessed gate structures, the leakage current from the capacitor structure in the DRAM can be reduced. Therefore, the DRAM having recessed gate structures has gradually replaced DRAM having planar gate structures under the current mainstream development trend. Generally, the DRAM cell having recessed gate structure may include a transistor element and a capacitor element connected in series, which is configured to receive voltage information from word lines (WL) and bit lines (BL). However, due to the limitation of fabricating technology, the existing DRAM cell having recessed gate structure still have many defects, and the present technology needs further improvement to effectively improve the efficiency and reliability of related memory devices.

SUMMARY OF THE INVENTION

One of the objectives of the present disclosure provides a semiconductor memory device and a method of fabricating the same, in which a plurality of storage node contacts and a plurality of dummy storage node contacts are respectively formed within a dense region and an iso region of the semiconductor memory device, so that the same luminous flux is maintained in two different regions while performing a photolithography process, which is beneficing on improving the fabricating yield of the semiconductor memory device. Accordingly, the dummy storage node contacts are formed without performing additional fabricating processes, and the aforementioned structure defects possibly caused by the limited fabricating technology are improved, so as to form the semiconductor memory device with more reliable components under a simplified process flow.

To achieve the purpose described above, one embodiment of the present disclosure provides a semiconductor memory device including a substrate, a plurality of buried word lines, a plurality of storage node contacts, and a plurality of storage node pads. The substrate includes a plurality of active areas and a shallow trench isolation. The buried word lines are embedded in the substrate, across the shallow trench isolation and the active areas. The storage node contacts are disposed on the substrate and directly contacted the active areas, and the storage node contacts includes a plurality of first plugs, wherein the first plugs includes an insulating material and a conductive material stacked sequentially from bottom to top. The storage node pads are disposed on the storage node contacts, wherein one of the storage node pads physically contacts at least two of the first plugs.

To achieve the purpose described above, one embodiment of the present disclosure provides a semiconductor memory device, including a substrate, a plurality of buried word lines, and a plurality of storage node contacts. The substrate includes a plurality of active areas and a shallow trench isolation. The buried word lines are embedded in the substrate, across the shallow trench isolation and the active areas. The storage node contacts are disposed on the substrate to directly contacted the active area, the storage node contacts includes a plurality of first plugs, wherein each of the first plugs includes an insulating material and a conductive material stacked from bottom to top, and at least one of the active areas directly contacts two of the first plugs at the same time.

To achieve the purpose described above, one embodiment of the present disclosure provides a fabricating method of a semiconductor memory device, including the following steps. Firstly, a substrate is provided, and the substrate includes a plurality of active areas and a shallow trench isolation. Next, a plurality of buried word lines is formed in the substrate, with the buried word lines being embedded in the substrate and disposed on the shallow trench isolation or on the active areas. Then, a plurality of storage node contacts is formed on the substrate, to directly contact the active areas, and the storage node contacts includes a plurality of first plugs, wherein each of the first plugs includes an insulating material and a conductive material stacked from bottom to top. After that, a plurality of storage node pads is formed on the storage node contacts, wherein one of the storage node pads physically contacts at least two of the first plugs at the same time.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are directed to provide a better understanding of the embodiments and are included as parts of the specification of the present disclosure. These drawings and descriptions are used to illustrate the principles of the embodiments. It should be noted that all drawings are schematic, and the relative dimensions and scales have been adjusted for the convenience of drawing. Identical or similar features in different embodiments are marked with identical symbols.

FIG. 1 to FIG. 8 are schematic diagrams illustrating a fabricating method of a semiconductor memory device according to a first embodiment of the present disclosure, in which:

FIG. 1 shows a schematic cross-sectional view of a semiconductor memory device after forming an insulating layer;

FIG. 2 shows a schematic cross-sectional view of a semiconductor memory device after performing an etching process;

FIG. 3 shows a schematic cross-sectional view of a semiconductor memory device after forming an insulating spacer;

FIG. 4 shows a schematic cross-sectional view of a semiconductor memory device after performing an epitaxial process;

FIG. 5 shows a schematic cross-sectional view of a semiconductor memory device after forming a mask layer;

FIG. 6 shows a schematic cross-sectional view of a semiconductor memory device after forming a storage node pads;

FIG. 7 shows a schematic cross-sectional view of a semiconductor memory device after forming an insulating material layer; and FIG. 8 shows a schematic cross-sectional view of a semiconductor memory device after performing an etching back process.

DETAILED DESCRIPTION

To provide a better understanding of the presented disclosure, preferred embodiments will be described in detail. The preferred embodiments of the present disclosure are illustrated in the accompanying drawings with numbered elements. In addition, the technical features in different embodiments described in the following may be replaced, recombined, or mixed with one another to constitute another embodiment without departing from the spirit of the present disclosure.

Figure 1:
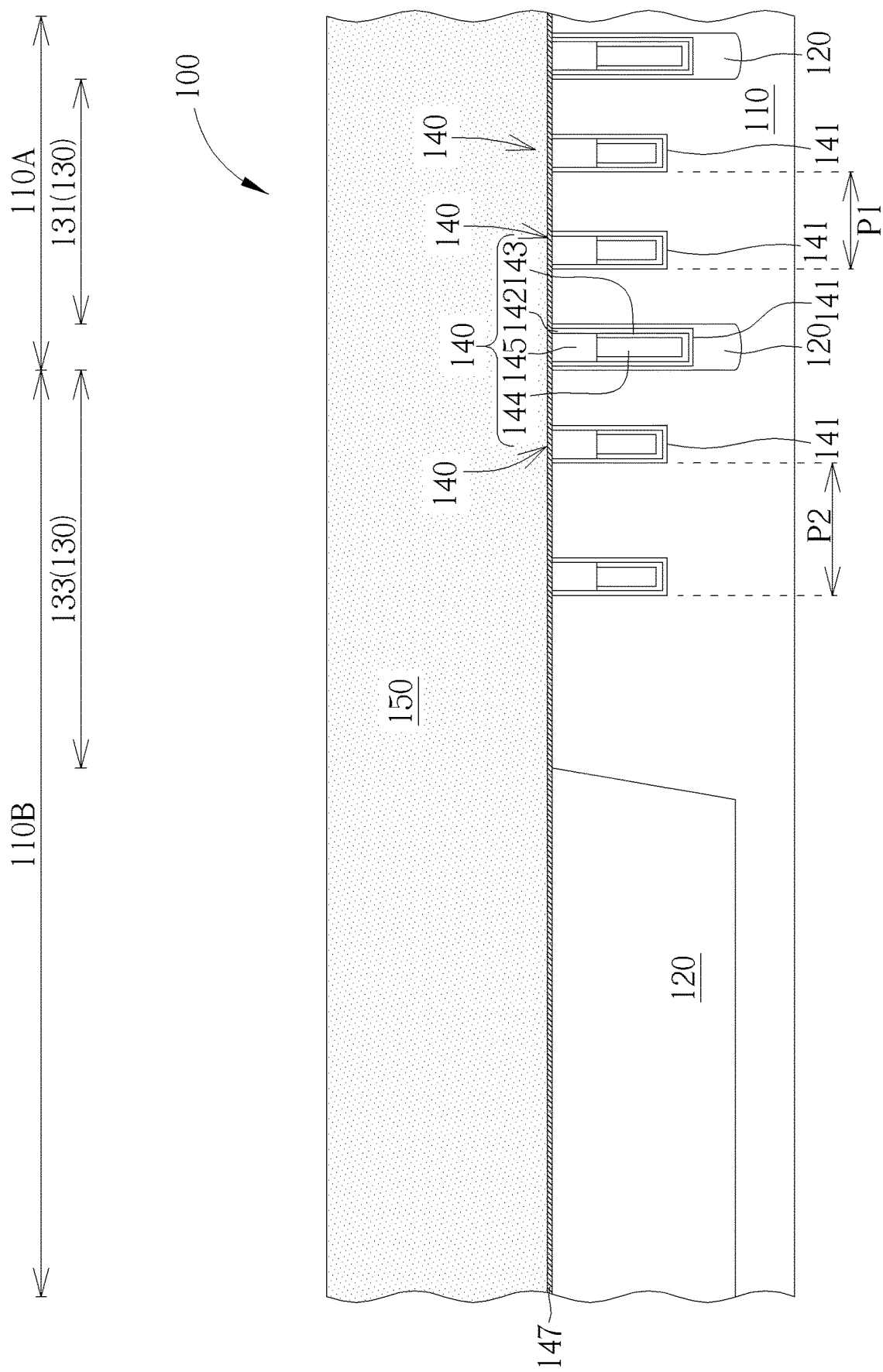

Please refer to FIG. 1 to FIG. 8, which are schematic diagrams illustrating a fabricating method of a semiconductor memory device 100 according to the first embodiment of the present disclosure. Firstly, as shown in FIG. 1, the semiconductor memory device 100 for example includes a substrate 110, such as a silicon substrate, a silicon-containing substrate (for example including a material like SiC, SiGe), or a silicon-on-insulator (SOI) substrate, and the substrate 110 further includes a memory cell region 110A being relative higher integrity and a periphery region 110B being relative lower integrity, disposed thereon. Preferably, the periphery region 110B is for example disposed on at least one side of the memory cell region 110A. For example, if being viewed from a top view (not shown in the drawings), the outer periphery of the memory cell region 100A may be entirely surrounded by the periphery region 110B, but not limited thereto.

Further in view of FIG. 1, at least one shallow trench isolation (STI) 120 is formed in the substrate 110, to define a plurality of active areas 130 in the substrate 110, so that, the active areas 130 may be surrounded by the shallow trench isolation 120. The active areas 130 further include active areas 131 formed within the memory cell region 110A and active areas 133 formed within the periphery region 110B. Preferably, the active areas 131 and the active areas 133 include different extending lengths, and the active areas 133 include a relative greater extending length, but not limited thereto. In one embodiment, the formation of the shallow trench isolation 120 may be accomplished by firstly performing an etching process to form a plurality of trenches (not shown in the drawings) in the substrate 110, within the memory cell region 110A and the periphery region 110B, followed by filling an insulating material such as silicon oxide or silicon oxynitride in the trenches, and the shallow trench isolation 120 is formed after performing a planarization process, but not limited thereto.

Furthermore, a plurality of buried gate structures 140 is formed in the substrate 110, with each of the buried gate structures 140 includes a dielectric layer 142, a gate dielectric layer 143, a gate electrode 144, and a capping layer 145 stacked from bottom to top, wherein the surface of the capping layer 145 of each buried gate structure 140 may be coplanar with the top surface of the substrate 110, with the buried gate structures 140 being serve as buried word lines (WLs) of the semiconductor device 100 for receiving or transmitting the voltage signals from each memory cell (not shown in the drawings). In one embodiment, the formation of the gate structures 140 includes but not limited to the following steps. Firstly, a plurality of trenches 141 is formed in the substrate 110, then, the dielectric layer 142 covering the entire surfaces of each trench 141, the gate dielectric layer 143 covering the bottom surfaces of each trench 141, and the gate electrode 144 filling in the bottom of each trench 141 are sequentially formed, and the capping layer 145 filling in the top of each trench 141 is formed after etching back a portion of the gate electrode 144 and the gate dielectric layer 143. It is noted that, the gate structures 140 formed within the memory cell region 110A are sequentially arranged by the same pitch P1, to simultaneously intersect with the active areas 131 and the shallow trench isolation 120, and the gate structures 140 formed within the periphery region 110B are sequentially arranged by a relative greater pitch P2 (the pitch P2 being greater than the pitch P1), to simultaneously intersect with the active areas 133 and the shallow trench isolation 120.

Although the entire extending directions of the active areas 130 (including the active areas 131 and the active areas 133), and the gate structures 140 are not precisely illustrated in the drawings of the present embodiment, people well-skilled in the art should fully realizes that if being viewed from a top view (not shown in the drawings), each of the active areas 131, 133 is extended along a first direction (not shown in the drawings), to together arrange in an array arrangement in the memory cell region 110A and the periphery region 110B, and each gate structure 140 is parallelly extended with each other along a second direction (not shown in the drawings), across the active areas 131, 133 and the shallow trench isolation 120, with the second direction being crossed but not perpendicular with the first direction. In one embodiment, the active areas 133 may further include a first portion (not shown in the drawings) extending along the second direction and a second portion (not shown in the drawings) extending along a third direction (not shown in the drawings) being perpendicular with the second direction, to present in a rectangular shape or other suitable shapes surrounding outside the periphery of the active areas 131. With these arrangements, the first portion and the second portion of the active areas 133 may perform like a protecting structure, and the structural collapse or damage of the active areas 131 within the memory cell region 110A may be successfully avoided.

Next, a plurality of bit line contacts (BLC, not shown in the drawings) is formed in the substrate 110, and a plurality of bit lines (BL, not shown in the drawings), a dielectric layer 147, and an insulating layer 150 filled in the gaps between the bit lines are formed on the substrate 110. The bit lines are parallelly and separately extended along the third direction, to intersect with the buried word lines (namely, the gate structures 140) and the active areas 131 within the memory cell region 110A, and the bit line contacts and the bit lines may be monolithic, with the bit line contacts directly contacting the active areas 131 respectively for receiving and transmitting the voltage signals from the memory cell. In one embodiment, each of the bit lines for example includes a semiconductor layer (for example including polysilicon, not shown in the drawings), a barrier layer (for example including titanium and/or titanium nitride, not shown in the drawings), a conductive layer (for example including a low-resistant metal like tungsten, aluminum, or copper, not shown in the drawings), and a capping layer (for example including silicon oxide, silicon nitride, or silicon oxynitride, not shown in the drawings), the dielectric layer 147 preferably includes a multilayer structure for example including an oxide-nitride-oxide (ONO, not shown in the drawings) structure, and the insulating layer 150 for example includes an insulating material like silicon oxide, or silicon oxynitride, but is not limited thereto.

Figure 2:
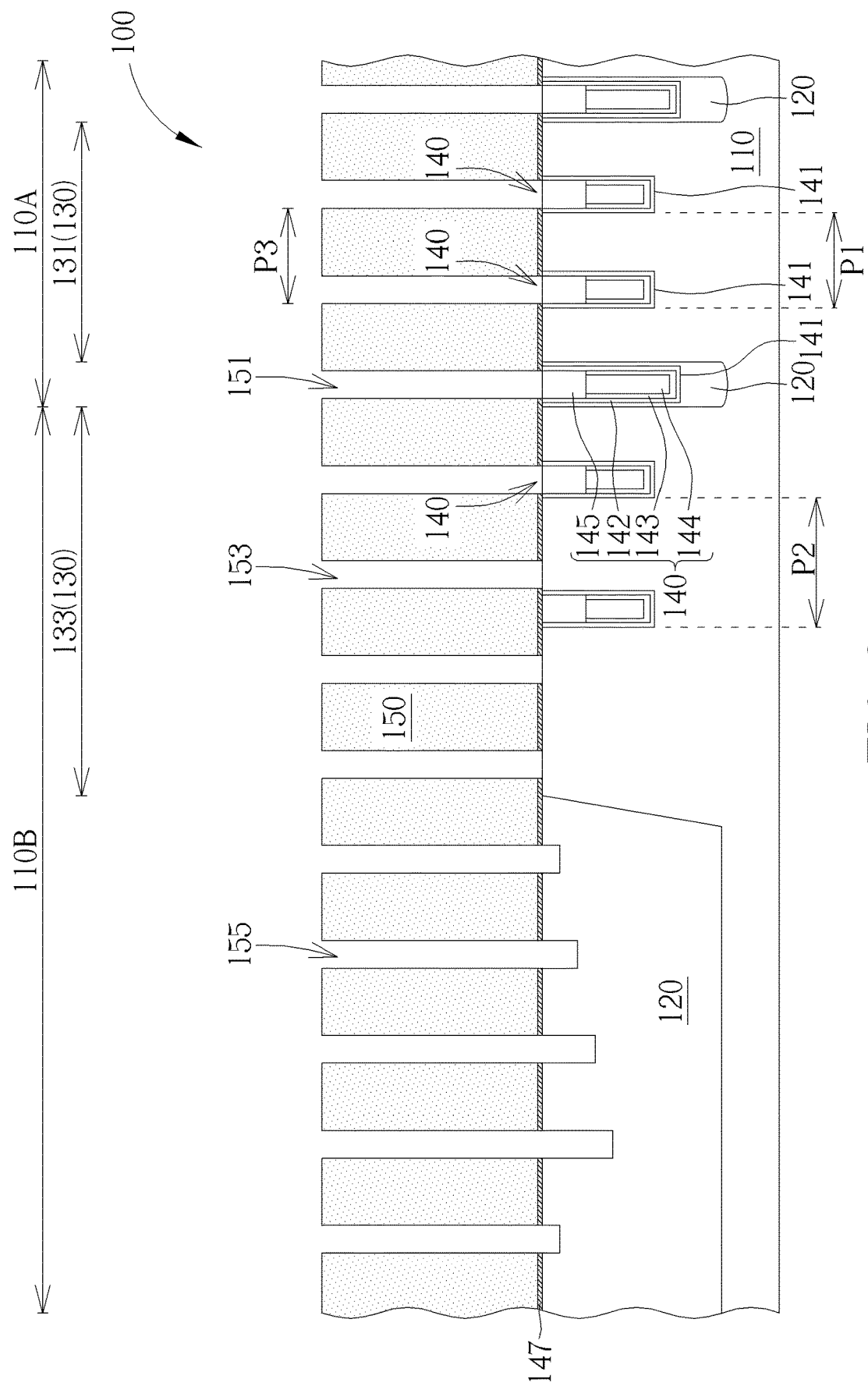

As shown in FIG. 2, a mask layer (not shown in the drawings) is formed on the insulating layer 150, and an etching process such as a dry etching process is performed through the mask layer, to form a plurality of openings 151, 153, 155 which are penetrated through the insulating layer 150 and the dielectric layer 147. The openings 151, 153, 155 are sequentially arranged for example by the same pitch P3, and preferably the pitch P3 is the same as the pitch P1 and is smaller than the pitch P2, but is not limited thereto. Precisely speaking, since the openings 151 formed within the memory cell region 110A have substantially the same pitch as that of the gate structures 140 (the pitch P3 is the same as the pitch P1), the openings 151 within the memory cell region 110A are right in alignment with the gate structures 140 disposed in the substrate 110, with the capping layer 145 of the gate structures 140 being exposed from the openings 151 respectively.

On the other hand, since the gate structures 140 formed within the periphery region 110B have a relative greater pitch (namely, the pitch P2), the openings 153, 155 formed within the periphery region 110B are not in alignment with the gate structures 140 within the periphery region 110B, with only a portion of the openings 153 exposing the entire covering layer 145, and the rest of the openings 153, 155 only partially exposing the surfaces of the active areas 133, partially surface of the gate structures 140, or the shallow trench isolation 120. Also, since there is a relatively smaller or the same etching selectivity between the materials of the insulating layer 150 and the shallow trench isolation 120, and there is a relatively greater etching selectivity between the materials of the insulating layer 150 and the capping layer 145, each of the openings 155 is capable of penetrating the surface of the shallow trench isolation 120 and extending downwardly into a portion of the shallow trench isolation 120, in particular to the shallow trench isolation 120 within the periphery region 110B, and each of the openings 151, 153 is only capable of extending to the surfaces of the capping layer 145 or the active areas 133, as shown in FIG. 2. In other words, the formation of the openings 155 is mainly caused by an excessively etching performance during the etching process, and the etching profiles in the openings 155 are all diverse, so that the openings 155 may obtain the bottom surfaces with different heights.

Figure 3:
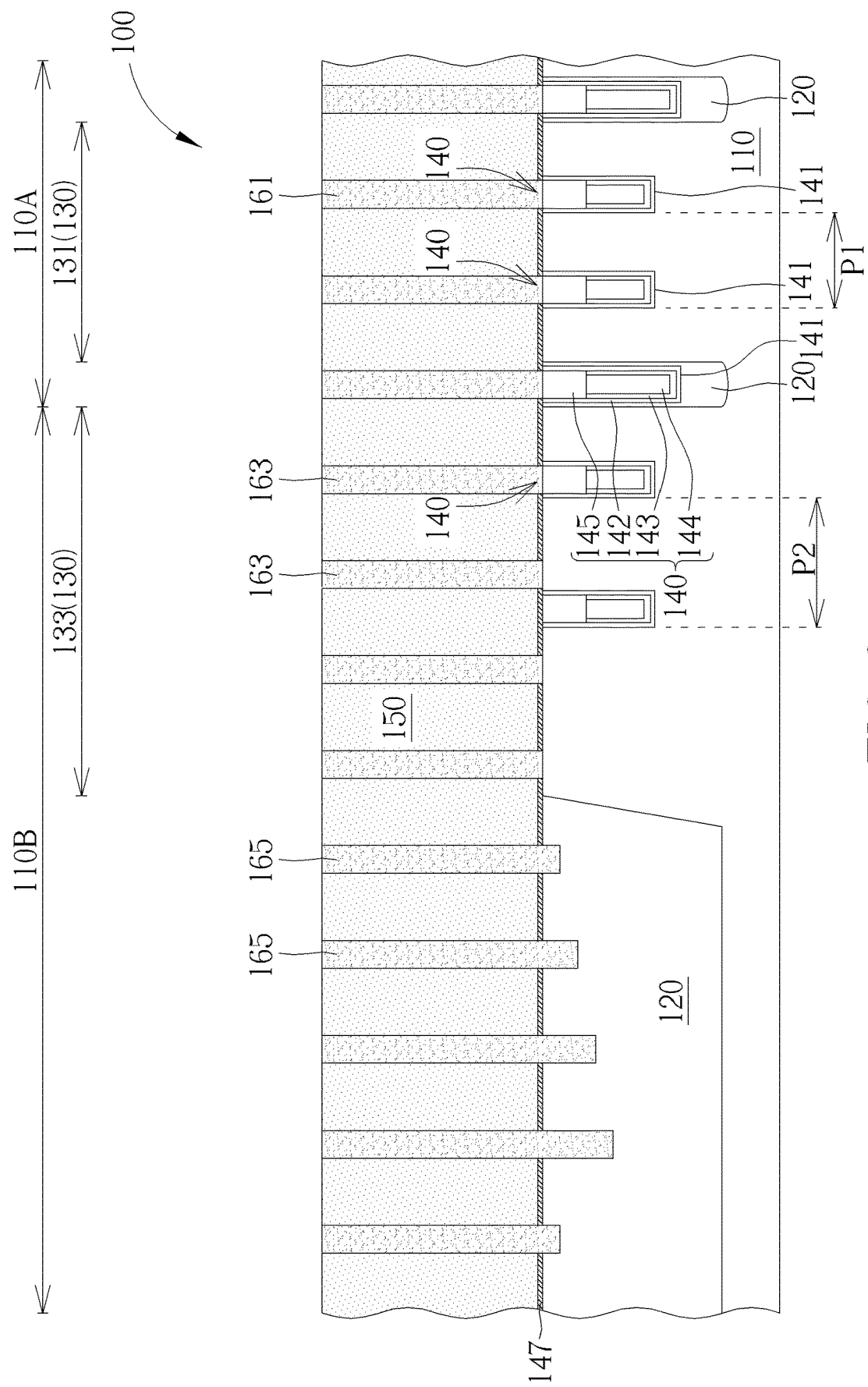

As shown in FIG. 3, a deposition process and an etching back process are sequentially performed to form a plurality of insulating spacers 161, 163, 165 filled up the openings 151, 153, 155 respectively, with each of the insulating spacers 161, 163, 165 extending along the third direction, between each of the bit lines. The insulating spacers 161 formed within the memory cell region 110A respectively contact the covering layer 145 of the gate structures 140, and the insulating spacers 163, 165 formed within the periphery region 110B respectively contact the surfaces of the active areas 133 or the shallow trench isolation 120. It is noted that, as controlling the parameters like the opening size, the opening spacing, the etching time, and the position of the openings in the peripheral region 110B in the present embodiment, the insulating spacers 165 formed within the peripheral region 110B are further extended into the portion of the shallow trench isolation 120, thereby dramatically increasing the aspect ratio of the openings, as well as the difficulty of etching the openings and backfilling the insulating material. Accordingly, the insulating spacers 165 may therefore obtain the bottom surfaces with different heights, as shown in FIG. 3.

Figure 4:
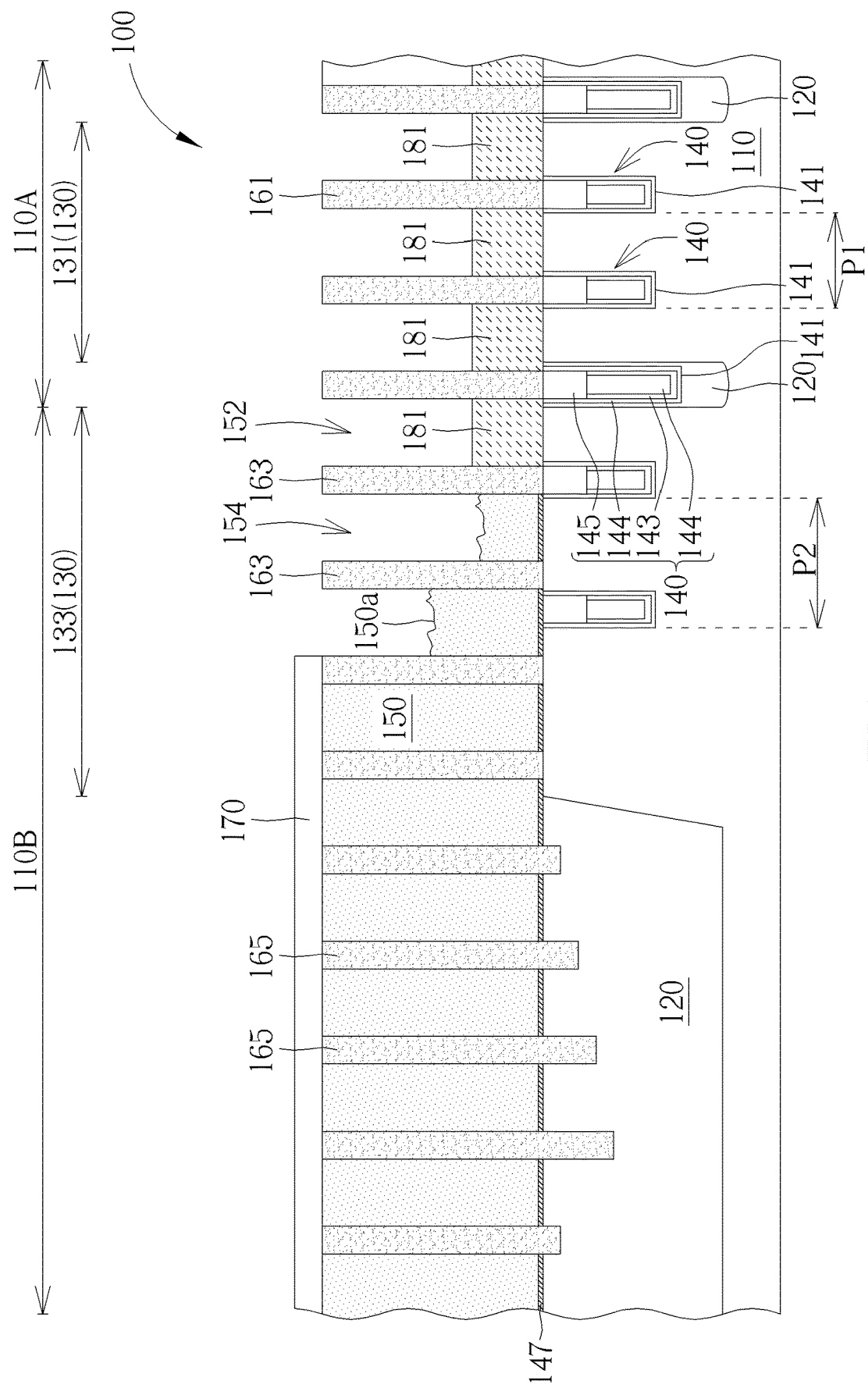

As shown in FIG. 4, a mask layer 170 is formed on the insulating layer 150 and the insulating spacers 161, 163, 165, covering on the insulating layer 150 and the insulating spacers 163, 165 within the periphery region 110B, so that, the insulating layer 150 and the insulating spacers 161 within the memory cell region 110A are completely exposed from the mask layer 170, and the insulating spacers 163 closed to the memory cell region 110A and the insulating layer 150 at two sides thereof are partially exposed from the mask layer 170. Then, an etching process such as a wet etching process is performed through the mask layer 170, to completely remove the insulating layer 150 and the dielectric layer 147 within the memory cell region 110A, and a plurality of openings 152 is formed accordingly, to expose the surfaces of the active areas 131, and also, a plurality of openings 154 is formed at the same time due to partially removing the insulating layer 150 at two sides of the insulating spacers 163 which is closed to the memory cell region 110A. After that, a selective epitaxial growth (SEG) process is performed also through the mask layer 170, to form a plurality of epitaxial layers 181 on the exposed surface of the active areas 131, and the mask layer 170 is removed then. In one embodiment, the epitaxial layers 181 for example include a conductive material such as silicon (Si), silicon phosphide (SiP), silicon germanium (SiGe), or germanium (Ge), but not limited thereto.

It is noted that due to the various integration degrees between the memory cell region 110A and the peripheral region 110B, the micro loading effect is easily occurred on the openings 154 within the periphery region 110B and closed to the memory cell region 110A, through controlling the parameters like the size of the openings 154, the spacing and the size of the insulating spacers 163, 165, and the etching time, so as to result in the incompletely etching profiles during the etching process. Accordingly, the insulating spacers 163 closed to the memory cell region 110A, as well as the insulating layer 150 at two sides thereof, are only partially removed, without exposing the surfaces of the active areas 133 underneath, and without forming any epitaxial layer during the SEG process. In addition, since the various etching degrees during the etching process, the remained insulating layer 150 at two sides of the insulating spacers 163 may obtain the top surface with different heights, and also an uneven etching surface 150a accordingly, as shown in FIG. 4.

Figure 5:
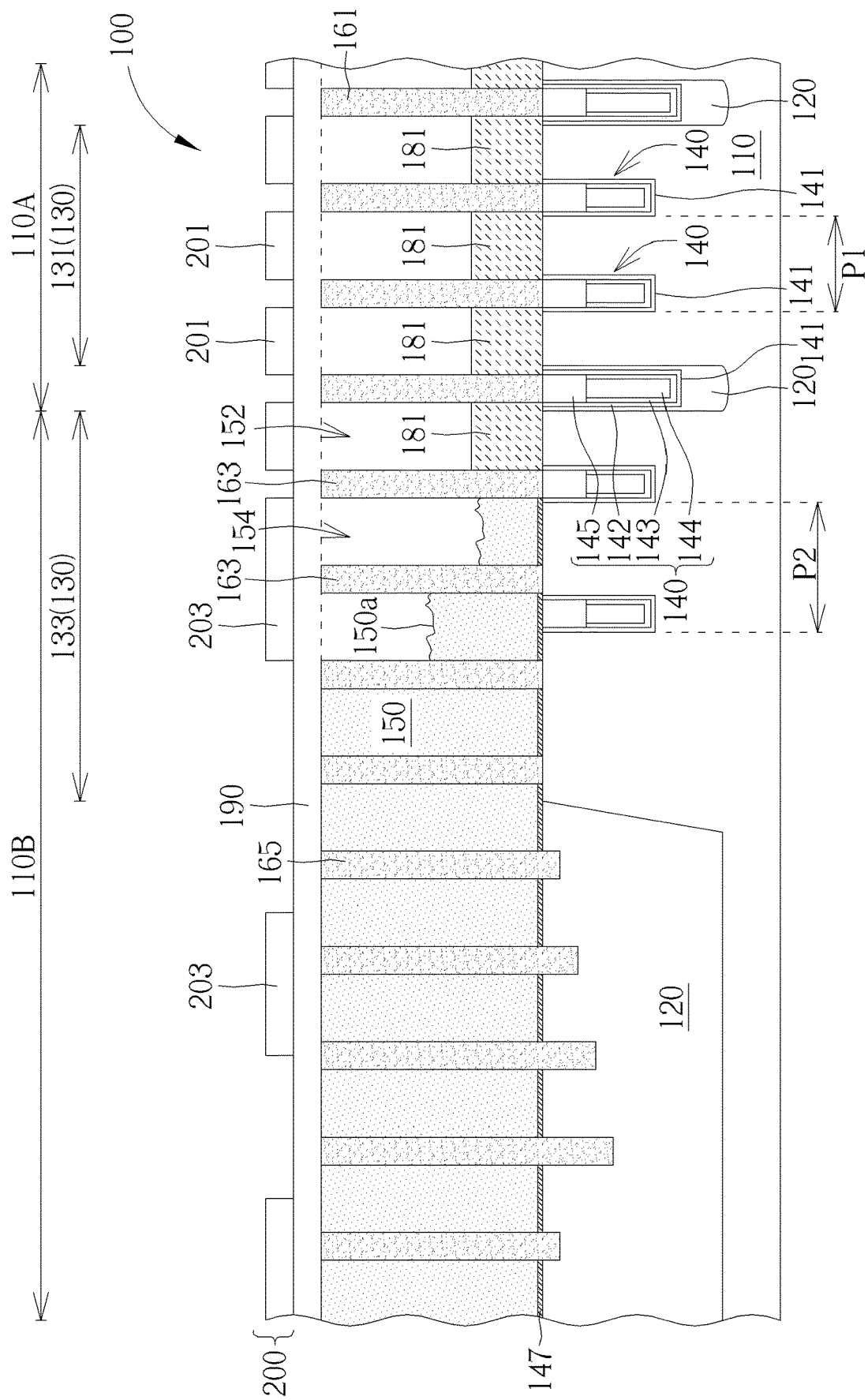

As shown in FIG. 5, a deposition process is performed on the substrate 110, to form a conductive material layer 190 filling in the openings 152, 154 and further covering on the top surfaces of the insulating spacers 161, 163, 165 and the insulating layer 150. In one embodiment, the conductive material layer 190 for example includes a conductive material like tungsten, titanium, or copper, but is not limited thereto. In one embodiment, a barrier layer (not shown in the drawings) may be firstly formed before forming the conductive material layer 190, with the barrier layer for example including a material like titanium/titanium nitride (TiN), tantalum (Ta)/tantalum nitride (TaN), but not limited thereto.

Then, a mask layer 200 is formed on the conductive material layer 190, and the mask layer 200 includes a plurality of mask patterns 201, 203. Precisely speaking, the mask patterns 201 formed within the memory cell region 110A include a relative smaller width and pitch, which are respectively in alignment with the conductive material layer 190 filled in each opening 152, and the mask patterns 203 formed within the periphery region 110B include a relative greater width and pitch, so as to reduce the difference of pattern integration between the memory cell region 110A and the periphery region 110B. Accordingly, each of the mask patterns 203 is capable of simultaneously covering the conductive material layer 190 filled in all of the openings 154, or simultaneously covering more than one of the insulating spacers 165 and the insulating layer 150 at two sides thereof, as shown in FIG. 5.

Figure 6:
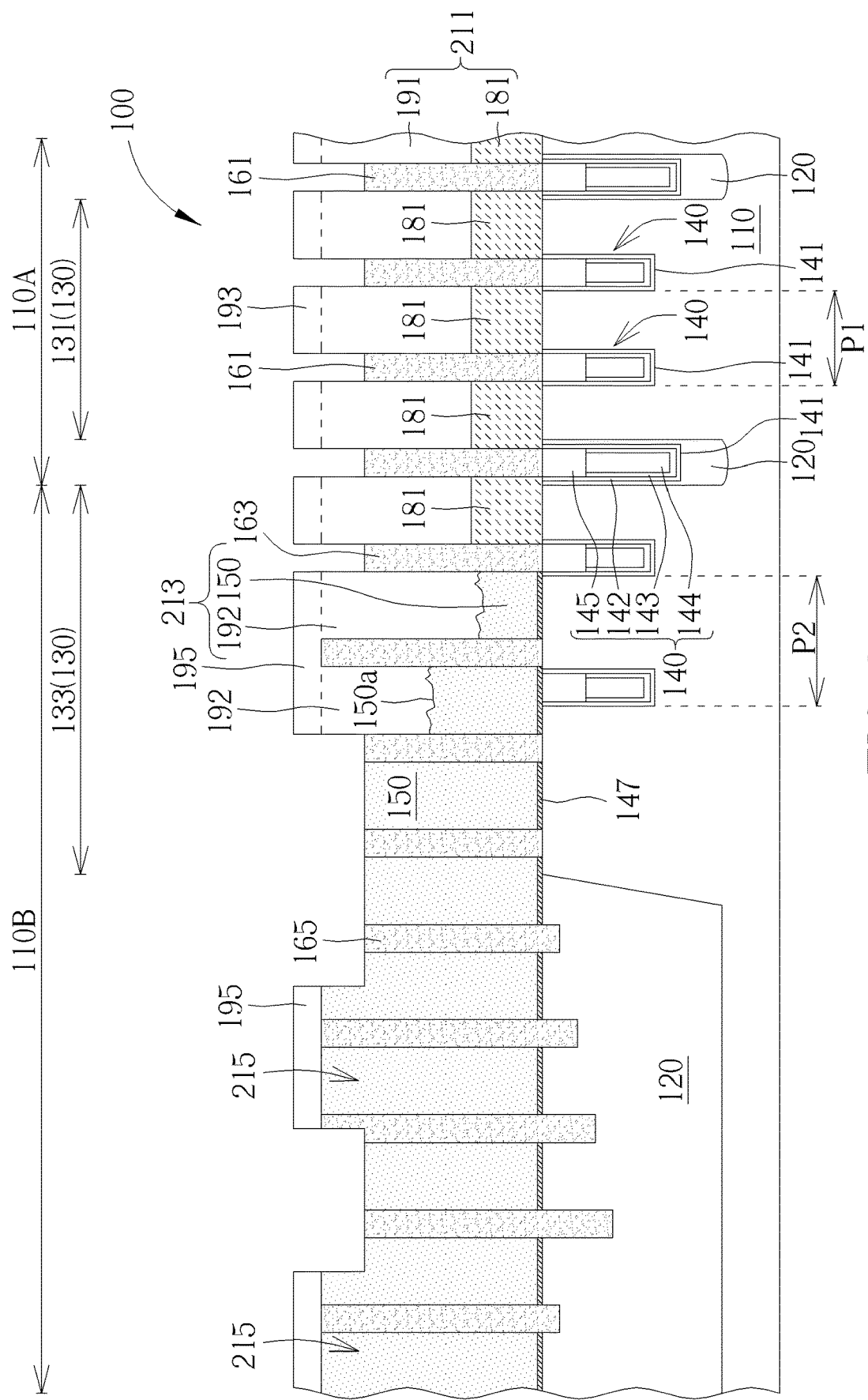

Following these, an etching process such as a dry etching process is performed through the mask layer 200, to pattern the conductive material layer 190 covered on the top surfaces of the insulating spacers 161, 163, 165 and the insulating layer 150, and to expose the top surfaces of the insulating spacers 161, 163, 165 and the insulating layer 150 underneath, and the exposed insulating spacers 161, 163, 165 and the insulating layer 150 are removed. Then, the mask layer 200 is removed. Accordingly, as shown in FIG. 6, a plurality of conductive layers 191, 192 is formed in the openings 152, 154 respectively, and also, a plurality of conductive pads 193, 195 is formed over the conductive layers 191, 192. It is noted that, the conductive layers 191, and the conductive pads 195 formed within the memory cell region 110A are sequentially stacked on the epitaxial layers 181, and the epitaxial layers 181 and the conductive layers 191 both include the conductive materials may together form a plurality of plugs 211. The plugs 211 is disposed between the adjacent ones of the insulating spacers 161 and the buried word lines (namely, the gate structures 140) and include the top surface which is higher than that of the insulating spacers 161, so that, the plugs 211 may physically contact the conductive pads 193 hereabove, and the active areas 131 underneath. Through these arrangements, the plugs 211 may be electrically connected to the transistors disposed within the active areas 131 via the epitaxial layers 181 disposed at the bottom, and electrically connected to a capacitor formed in the subsequent process via the conductive pads 193 disposed at the top.

On the other hand, the conductive layers 192 disposed within the periphery region 110B are stacked on the etching surface 150a of the insulating layer 150, and the insulating material (namely, the insulating layer 150) and the conductive material (namely, the conductive layer 192) stacked sequentially between the adjacent ones of the insulating spacers 163 together form a plurality of plugs 213, to physically contact the active areas 133 underneath. The plugs 213 have the top surface which is the same or higher than the top surface of the insulating spacers 163, wherein a portion of the plugs 213 is not completely located between the adjacent ones of the buried word lines, and even partially overlapped with the buried word lines in the direction perpendicular to the substrate 110. Accordingly, the plugs 213 may not be electrically connected with the transistor within the active areas 133, and at least two of the plugs 213 are physically contacted with the same one of the conductive pads 195 at the same time, to serve as dummy plugs. In the present embodiment, all of the plugs 213 are physically connected to the same one of the conductive pads 195, as shown in FIG. 6, but not limited thereto. Also, the rest of the conductive pads 195 disposed within the periphery region 110B are physically contacted to the insulating spacers 165 and/or the insulating layer 150 over the shallow trench isolation 120 at the same time, so that, the insulating layer 150 disposed between the adjacent ones of the insulating spacers 165, over the shallow trench isolation 120 also form a plurality of dummy plugs 215, as shown in FIG. 6.

Figure 7:
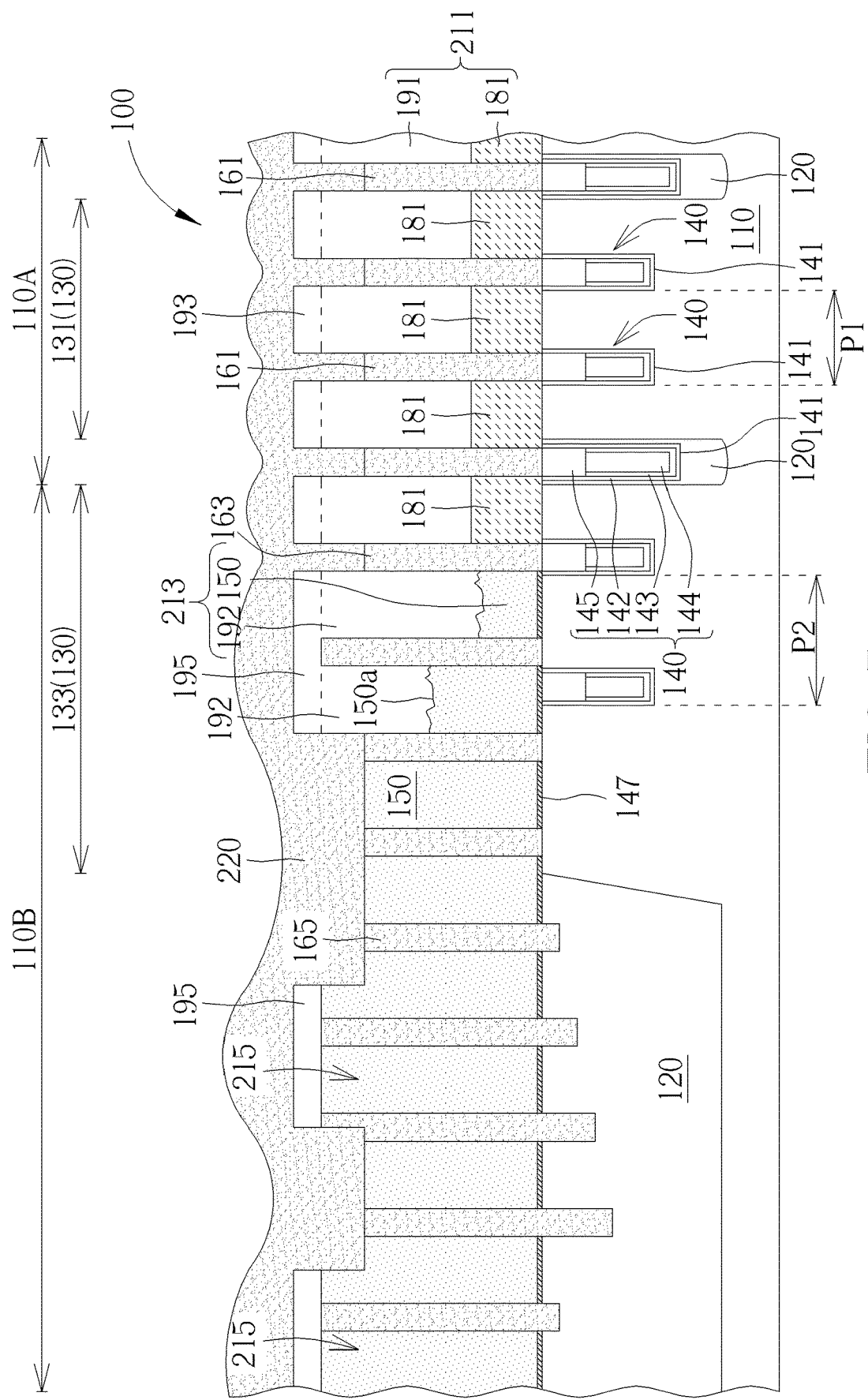

As shown in FIG. 7, a deposition process is performed on the substrate 110 to form an insulating material layer 220, conformally covering on the top surfaces of the conductive pads 193, 195 to fill up the spaces between the conductive pads 193 and to partially fill in the spaces between the conductive pads 195. In one embodiment, the insulating material layer 220 for example includes an insulating material like silicon nitride or silicon carbonitride, and preferably includes an insulating material which is the same as that of the insulating spacers 161, 163, 165, but not limited thereto.

Figure 8:
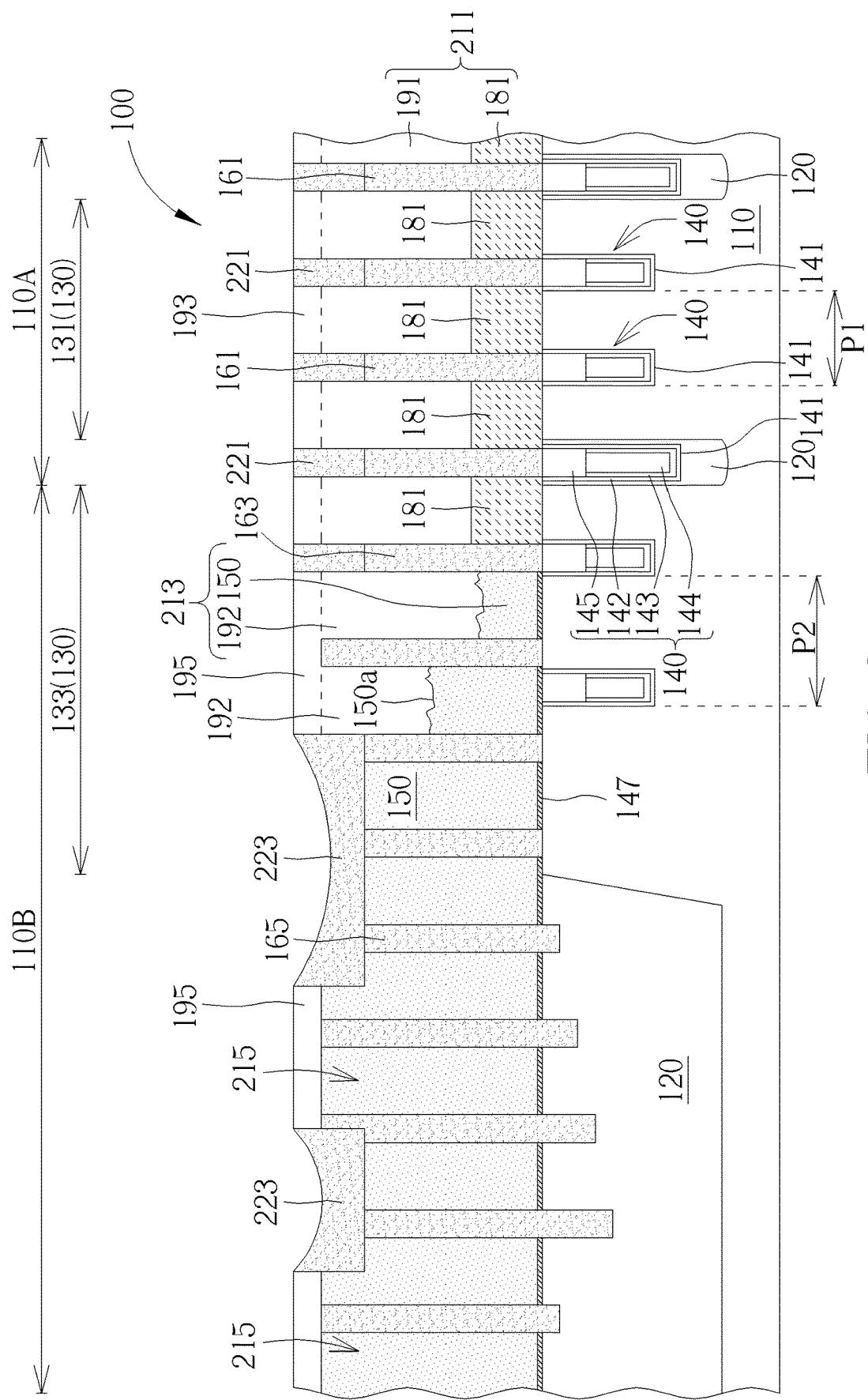

Following these, as shown in FIG. 8, an etching back process is performed to remove the insulating material layer 220 covered on the top surface of each of the conductive pads 193, 195, to form an insulating layer 221 filled in the space between the conductive pads 193, and an insulating layer 223 filled in the space between the conductive pads 195. The insulating layer 221 formed within the memory cell region 110A have the top surface being coplanar with the top surfaces of the conductive pads 193, 195, and which may directly contact the insulating spacers 161 underneath. The insulating layer 223 formed within the periphery region 110B have a relative lower, sunken top surface which is not coplanar with the top surface of the conductive pads 195, and which may also directly contact the insulating spacers 163, 165 underneath. Based on above-mentioned processes, the semiconductor memory device 100 of the first embodiment in the present disclosure is accomplished.

According to the first embodiment of the present disclosure, the semiconductor memory device 100 includes the buried word lines (namely, the gate structures 140) embedded in the substrate 110, the plugs 211, 213, 215 and the insulating spacers 161, 163, 165 disposed on the substrate 110, wherein the insulating spacers 161, 163, 165 and the plugs 211, 213, 215 are alternately arranged with each other on the substrate 110. It is noted that, each of the plugs 211, 213, 215 are configured as storage node contacts (SNCs) of the semiconductor memory device 100, and the conductive pads 193, 195 are configured as storage node pads (SN pads) of the semiconductor memory device 100, to be disposed on the storage node contacts for electrically connecting thereto. Precisely speaking, each of the plugs 211 includes the epitaxial layer 181 (including the conductive material) and the conductive layer 191 (including the conductive material) stacked sequentially, for electrically connecting to the transistor within the substrate 110, and the plugs 211 may be further electrically connected to the capacitor via the conductive pads 193 hereabove, thereby forming the smallest memory cell of the semiconductor memory device 100 for receiving or transmitting required signals.

On the other hands, each of the plugs 213 included the insulating layer 150 (including the insulating material) and the conductive layer 192 (including the conductive material) stacked sequentially, and the plugs 215 are completely formed by the insulating layer 150 (including the insulating material), with two or more than two of the plugs 213 simultaneously contacting the active areas 133, and/or the storage node pads (namely, the conductive pads 195), and with the plugs 215 directly contacting the shallow trench isolation 120. Accordingly, both of the plugs 213, 215 may not be electrically connected to any transistor, so as to serve as the dummy plugs thereby. In other words, the fabricating method of the present disclosure easily leads to micro loading effect or incompletely etching issues in the etching process due to the various component densities between the memory cell region 110A and the peripheral region 110B of the semiconductor memory device 100, so as to form the dummy storage node contacts within the periphery region 110B under a simplified process flow. With these performances, the dummy storage node contacts may be formed without performing additional fabricating processes, and also, the low yield issue caused by low component density in the peripheral region 110B may be improved, accordingly.

Furthermore, it is also noted that each of the insulating spacers 161 are formed above the gate structures 140 to in alignment with thereto, and however, the insulating spacers 163 are not in alignment with the gate structure 140 within the periphery region 110B (having the relative greater pitch P2) underneath. Then, the insulating spacers 163 are disposed over the active areas 133, or only partially overlapped with the gate structures 140 underneath. With these arrangements, the process tolerance or process window of components within the periphery region 110B is dramatically improved, to prevent the micro loading effect or the etching defects caused by the various component densities from negatively affecting the overall structure of the semiconductor memory device 100, which is beneficial on achieving more optimized structural integrity and efficiency.

However, people well known in the arts should easily realize the semiconductor memory device and the fabricating method thereof in the present disclosure is not limited to the aforementioned embodiment, and may further include other examples or variety. The following description will detail the different embodiments of the semiconductor memory device and fabricating method thereof in the present disclosure. To simplify the description, the following description will detail the dissimilarities among the different embodiments and the identical features will not be redundantly described. In order to compare the differences between the embodiments easily, the identical components in each of the following embodiments are marked with identical symbols.

Figure 9:
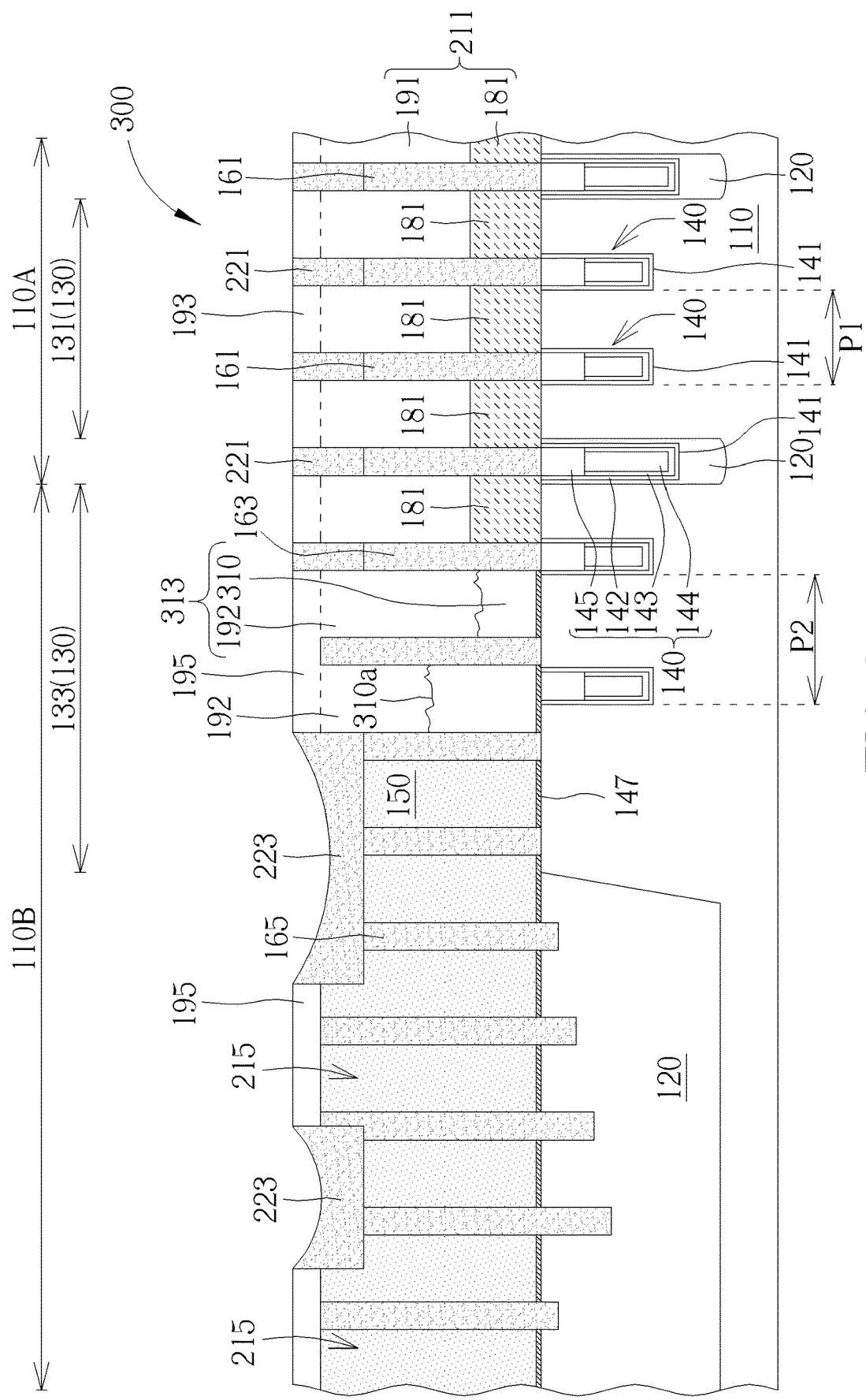
FIG. 9 is a schematic diagram illustrating a fabricating method of a semiconductor memory device according to a second embodiment of the present disclosure.

Please refer to FIG. 9, which is a schematic diagram illustrating a fabricating method of a semiconductor memory device 300 according to the second embodiment of the present disclosure. The fabricating method of the semiconductor memory device 300 in the present embodiment are substantially the same as those of the semiconductor memory device 100 in the aforementioned first embodiment, and all the similarities will not be redundantly described herein after. The difference between the present embodiment and the aforementioned first embodiment is in that after forming the epitaxial layers 181 (for example being shown in FIG. 4 of the first embodiment), another etching process such as a wet etching process is performed, to further remove the insulating layer 150 closed to the memory cell region 110A, to expose the dielectric layer 147 underneath. Then, the subsequent processes are continuously performed as shown in FIG. 5 to FIG. 8 of the aforementioned first embodiment, and the semiconductor memory device 300 of the second embodiment in the present disclosure is therefore accomplished based on above-mentioned processes.

It is noted that, due to the various integration degrees between the memory cell region 110A and the peripheral region 110B, the incompletely filling issue is easily occurred in the periphery region 110B closed to the memory cell region 110A while performing the deposition process of the conductive material layer 190 (as being shown in FIG. 5 of the aforementioned first embodiment), thereby forming a plurality of air gaps 310. The air gaps 310 have the top surfaces with different heights, or even have uneven surfaces 310a, as shown in FIG. 9. Then, the conductive layer 192 is formed sequentially on the air gaps 310 within the periphery region 110B, and the air gaps 310 (including an insulating material) and the conductive layer 192 (including the conductive material) will together form a plurality of plugs 313.

In another embodiment, plugs (not shown in the drawings) may also by formed by sequentially stacking the insulating layer 150, the air gaps, and the conductive layer 192. In addition, in another embodiment, the air gap of plugs (not shown in the drawings) may further extend into a portion of the substrate 110 because a portion of the substrate 110 may be further removed during performing the another etching process to remove the insulating layer 150 closed to the memory cell region 110A. Then, the air gap formed under the conductive layer 192 may therefore obtain a bottom surface with a step-height not shown in the drawings).

In the present embodiment, two or more than two of the plugs 313 simultaneously contact the active areas 133 and/or the storage node pads (namely, the conductive pads 195), without electrically connecting to any transistor, to serve as the dummy plugs thereby. Thus, the fabricating method of the present embodiment also forms the dummy storage node contacts without performing additional fabricating processes, and the low yield issue of the semiconductor memory device 300 caused by low component density in the peripheral region 110B may be improved.

Figure 10:
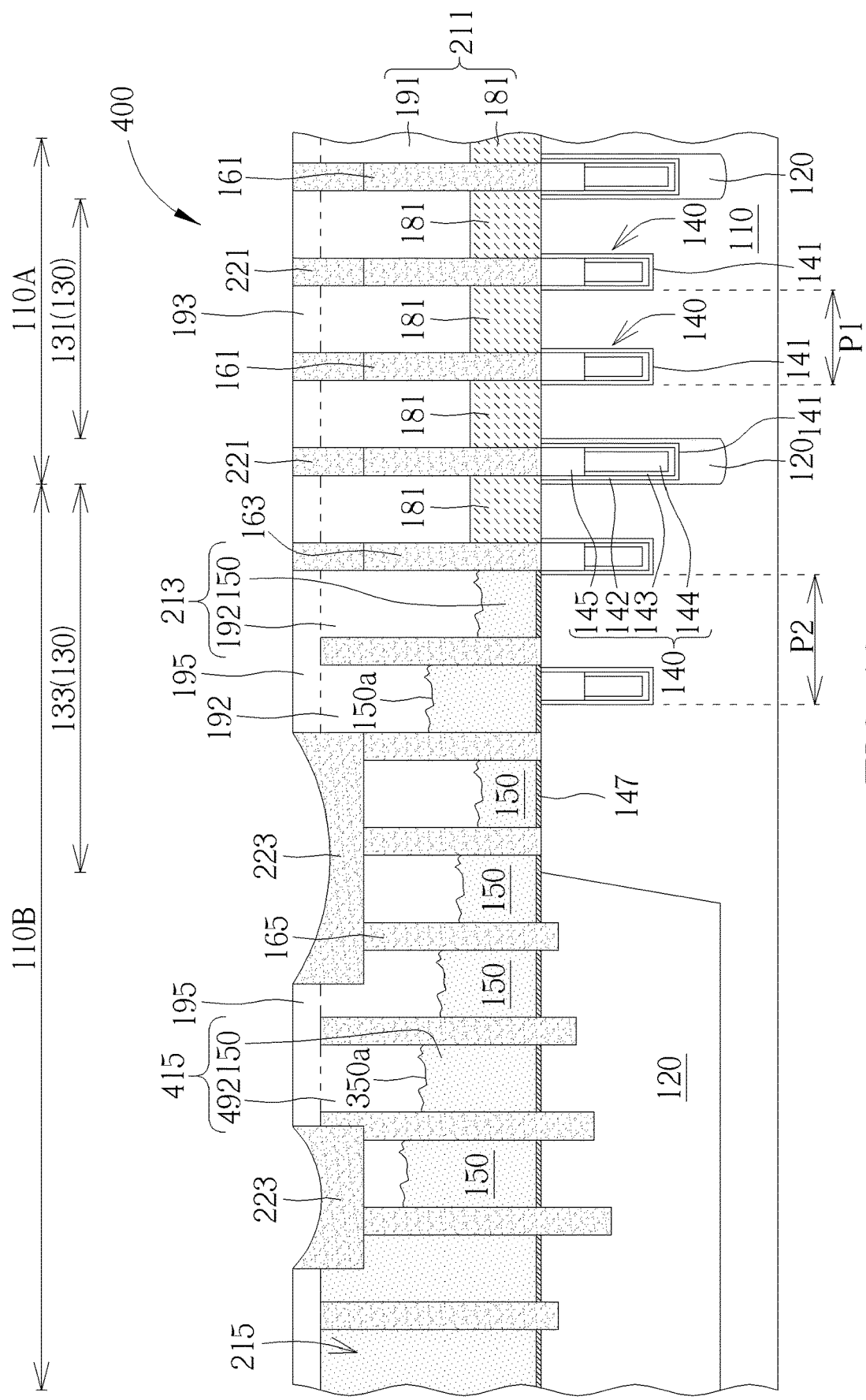
FIG. 10 is a schematic diagram illustrating a fabricating method of a semiconductor memory device according to a third embodiment of the present disclosure.

Please refer to FIG. 10, which is a schematic diagram illustrating a fabricating method of a semiconductor memory device 400 according to the third embodiment of the present disclosure. The fabricating method of the semiconductor memory device 400 in the present embodiment are substantially the same as those of the semiconductor memory device 100 in the aforementioned first embodiment, and all the similarities will not be redundantly described herein after. The difference between the present embodiment and the aforementioned first embodiment is in that the etching process of the insulating layer 150 (for example as shown in FIG. 4 of the aforementioned first embodiment) is performed through another mask layer (not shown in the drawings), to completely remove the insulating layer 150 within the memory cell region 110A, to partially remove the insulating layer 150 at two sides of the insulating spacers 163, and to partially remove the insulating layer 150 at two sides of the insulating spacers 165. Then, the subsequent processes are continuously performed as shown in FIG. 5 to FIG. 8 of the aforementioned first embodiment, to form the epitaxial layers 181 and other required elements, and the semiconductor memory device 400 of the third embodiment in the present disclosure is accomplished based on the aforementioned processes.

It is noted that, due to the various integration degrees between the memory cell region 110A and the peripheral region 110B, the insulating layer 150 is incomplete etched by controlling the etching parameters like the opening size, the opening spacer, or etching time, to obtain the top surfaces with different heights or uneven etching surfaces 350a, as shown in FIG. 10. Accordingly, each conductive layer 492 formed subsequently in the periphery region 110B is stacked on the etching surface 350a of the insulating layer 150, and the insulating layer 150 (for example including the insulating material), and the conductive layer 492 (for example including the conductive material) stacked sequentially will together form a plurality of plugs 415 to directly contact the shallow trench isolation 120 underneath. Also, two or more than two of the plugs 415 may contact to the storage node pads at the same time, and which cannot be electrically connected to any transistor, so as to serve as the dummy plugs, as shown in FIG. 10. In this way, the fabricating method of the present embodiment also forms the dummy storage node contacts without performing additional fabricating processes, and also, the low yield issue of the semiconductor memory device 400 caused by low component density in the peripheral region 110B may be improved, accordingly.

Overall speaking, the semiconductor memory device of the present disclosure includes a plurality of storage node contacts and a plurality of dummy storage node contacts respectively disposed in a dense region and an iso region with various component densities, so that the same luminous flux is maintained in two different regions during performing photolithography process, which is beneficing on improving the fabricating yield of the semiconductor memory device. Also, the dummy storage node contacts are formed mainly based on the micro loading effect or the incompletely etching issues caused by the aforementioned various integration degrees, without leading to additional fabricating processes. Thus, the fabricating method of the present disclosure is allowable to form the semiconductor memory device with more reliable components, to gain better performance.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor memory device, comprising:
a substrate, the substrate comprising a plurality of active areas and a shallow trench isolation;
a plurality of buried word lines, embedded in the substrate and across the shallow trench isolation and the active areas;
a plurality of storage node contacts, disposed on the substrate and contacted the active areas, the storage node contacts comprising a plurality of first plugs, wherein each of the first plugs comprises an insulating material and a conductive material stacked sequentially from bottom to top; and
a plurality of storage node pads, disposed on the storage node contacts, wherein one of the storage node pads physically contacts at least two of the first plugs.

2. The semiconductor memory device according to claim 1, wherein the first plugs partially overlap the buried word lines in a direction perpendicular to the substrate.

3. The semiconductor memory device according to claim 1, wherein the insulating material comprises silicon oxide or air gap.

4. The semiconductor memory device according to claim 1, wherein the insulating materials of the first plugs have top surfaces which are in different heights.

5. The semiconductor memory device according to claim 1, wherein the insulating materials of the first plugs have uneven etching surfaces.

6. The semiconductor memory device according to claim 1, wherein the insulating spacers extend into a portion of the shallow trench isolation and have bottom surfaces which are in different heights.

7. The semiconductor memory device according to claim 1, further comprising:
a plurality of insulating spacers, alternately disposed with the storage node contacts on the substrate, wherein each of the insulating spacers are spaced with each other by a same first pitch, and each of the buried word lines are spaced with each other by a second pitch or a third pitch, and the second pitch is the same as the first pitch, and the third pitch is greater than the first pitch.

8. The semiconductor memory device according to claim 1, wherein the storage node contacts further comprise a plurality of second plugs, and each of the second plugs directly contacts the shallow trench isolation and comprises an insulating material and a conductive material stacked from bottom to top, wherein the insulating materials of the second plugs have top surfaces which are in different heights.

9. The semiconductor memory device according to claim 1, wherein at least one of the active areas directly contacts two of the first plugs at the same time.

10. A semiconductor memory device, comprising:
a substrate, comprising a plurality of active areas and a shallow trench isolation;
a plurality of buried word lines, embedded in the substrate and across the shallow trench isolation and the active areas; and
a plurality of storage node contacts, disposed on the substrate to directly contacted the active area, the storage node contacts comprises a plurality of first plugs, wherein each of the first plugs comprises an insulating material and a conductive material stacked from bottom to top, and at least one of the active areas contacts two of the first plugs at the same time.

11. The semiconductor memory device according to claim 10, wherein the at least one active area surrounded at an outer periphery of other of the active areas.

12. The semiconductor memory device according to claim 10, wherein the storage node contacts comprises a plurality of second plugs, each of the second plugs directly contacts the shallow trench isolation and comprises an insulating material and a conductive material stacked form bottom to top, wherein the insulating materials of the second plugs comprise top surfaces which are in different heights.

13. The semiconductor memory device according to claim 10, wherein the first plugs are partially overlapped with the buried word lines in a direction perpendicular to the substrate.

14. The semiconductor memory device according to claim 10, wherein the insulating materials of the first plugs comprise top surfaces which are in different heights.

15. The semiconductor memory device according to claim 10, wherein the insulating materials comprise silicon oxide or air gap.

16. The semiconductor memory device according to claim 10, further comprising:
a plurality of insulating spacers disposed on the substrate, and the insulating spacers and the storage node contacts are alternately disposed with each other.

17. The semiconductor memory device according to claim 16, wherein top surfaces of the insulating spacers are coplanar with top surface of the conductive materials of the first plugs.

18. The semiconductor memory device according to claim 16, wherein the insulating spacers extend into a portion of the shallow trench isolation and comprise bottom surfaces which are in different heights.

19. A fabricating method of a semiconductor memory device, comprising:

providing a substrate, the substrate comprising a plurality of active areas and a shallow trench isolation surrounding the active areas;

forming a plurality of buried word lines in the substrate, the buried word lines being embedded in the substrate and across the shallow trench isolation or on the active areas;

forming a plurality of storage node contacts on the substrate, to directly contact the active areas, the storage node contacts comprising a plurality of first plugs, wherein each of the first plugs comprises an insulating material and a conductive material stacked from bottom to top; and forming a plurality of storage node pads on the storage node contacts, wherein one of the storage node pads physically contacts at least two of the first plugs at the same time.

20. The fabricating method of the semiconductor memory device according to claim 19, wherein the storage node contacts further comprise a plurality of second plugs, each of the second plugs directly contacts the shallow trench isolation and comprises an insulating material and a conductive material stacked from bottom to top.

* * * * *